THERMOELECTRIC MODULES
Filed Jan. 16, 1964
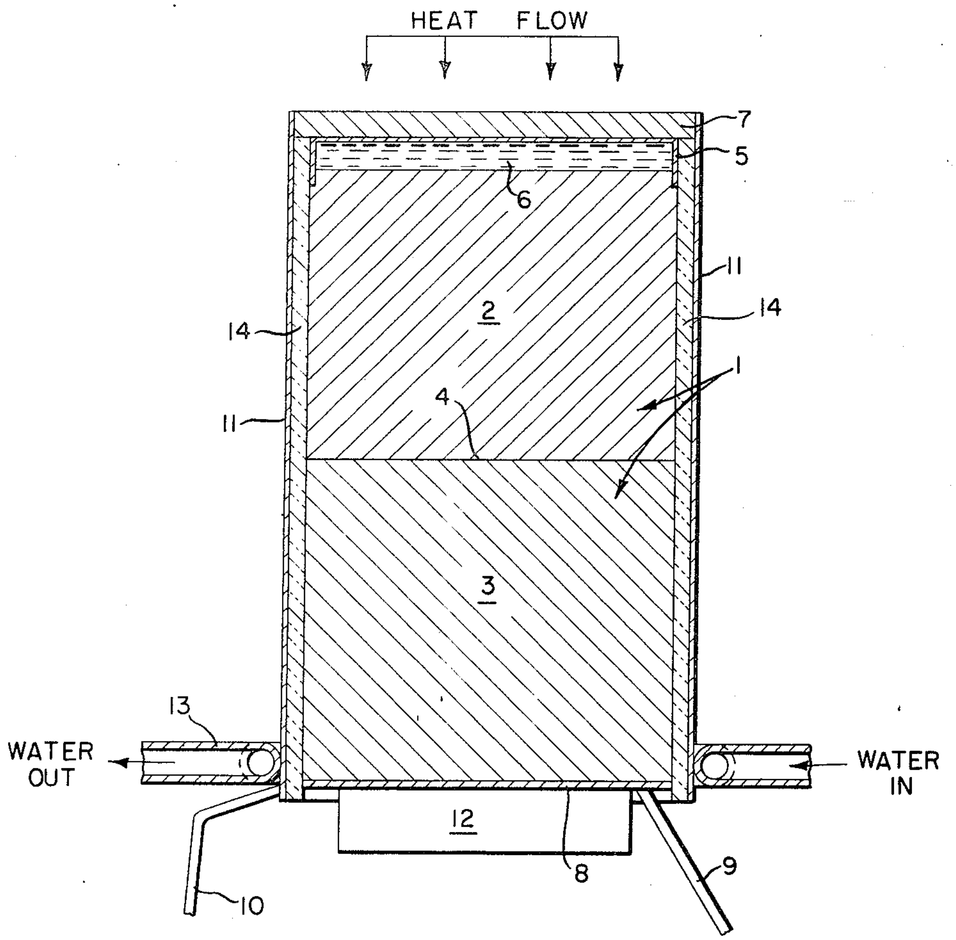
INVENTOR
HERBERT VALDSAAR
BY James J. Flynn
ATTORNEY United States Patent Office 3,362,853

Patented Jan. 9, 1968

3,362,853

THERMOELECTRIC MODULES

Herbert Valdsaar, Wilmington, Del., assignor to E. I. du Pont de Nemours and Company, Wilmington, Del., a corporation of Delaware Filed Jan. 16, 1964, Ser. No. 338,124
6 Claims. (Cl. 136—205)

This invention relates to novel thermoelectric modules. More particularly, it relates to new thermoelectric modules of improved construction which provide good electrical contacts within the modules and can withstand severe mechanical stresses during the heat cycling of the module.

Thermoelectric modules are well known devices used for converting heat into electrical work. The thermoelectric module is composed of a p-type leg, an n-type leg and a hot junction. In the construction of thermoelectric modules, the materials which comprise the hot junction or electrical contacts for the legs of the module serve to complete the electrical circuit. These materials must meet certain very stringent requirements. This is particularly true when the modules are to be operated at elevated temperatures, since the materials which are used must not only be able to withstand severe mechanical stresses during heat cycling through a wide range of temperatures, but must also meet other equally important requirements; they must be chemically inert to other materials comprising the module; they must be stable through the temperature range of operation of the module; and they must exhibit acceptable electrical properties, notably low electrical resistivity. Few materials have been found which can meet all of these requirements, and various materials and methods of construction for thermoelectric modules have been proposed to overcome the difficulties encountered.

It is an object of this invention to provide a thermoelectric module which will function satisfactorily over a wide temperature range, for example, up to 1000° C. and even higher. Another object of this invention is to provide a thermoelectric module in which mechanical stresses are substantially eliminated. A further object of the invention is to provide a thermoelectric module that exhibits extremely low electrical resistivities at high temperatures of the order of 900° C. to 1000° C. Another object of this invention is to provide a thermoelectric module having a hot junction contact of low electrical resistivity. These and other objects and advantages of the invention will become apparent from the following description of the invention wherein the single figure in the drawing illustrates a cross-sectional view of a thermoelectric module.

It has now been discovered that thermoelectric modules that utilize as a hot junction liquid contact for conventional n-type and p-type legs the materials bismuth, indium, cuprous selenide or cuprous sulfide can withstand severe mechanical stress during heat cycling through a wide range of temperatures of from about 155° C., when indium with the lowest melting point of these materials is used, to about 1150° C. when cuprous sulfide with the highest melting point of the materials is used. These materials are liquid at the operating temperatures of the module and are chemically inert to thermoelectric materials at these temperatures and, accordingly, provide low resistance hot junction liquid contacts in the modules. Furthermore, due to the fact that these materials are in the liquid phase at operating temperatures, mechanical stress during heat cycling is substantially minimized or completely eliminated from the module.

The thermoelectric materials used in the p-type leg of the module for contact with the hot junction liquid contact can be any thermoelectric materials which are chemically stable at the operating temperatures in the presence of the metal or compound chosen to be used as the liquid contact. These may be, for example, diselenides of niobium, tantalum or molybdenum. However, the preferred thermoelectric material is tungsten diselenide.

In a preferred embodiment of this invention a thermoelectric module is constructed of a conventional p-type leg of the thermoelectric material tungsten diselenide and a conventional n-type leg of the thermoelectric material constantan. When constantan is exposed to temperatures above about 800° C., it should be covered by an oxidation resistant material to protect it from corrosion in oxidizing atmospheres. If the temperature of operation of the device is to exceed about 1000° C., a commercial nickel-3% silicon alloy may be substituted for the constantan. A novel contact for the module legs at the hot junction in the module is made through metallic bismuth, which is in the liquid state at the temperature of operation of the module. The metal indium which is also a liquid at the operational temperature range indicated above has also been used with great success in addition to the compounds cuprous selenide and cuprous sulfide.

The preferred materials for the hot junction contact are bismuth and indium, and these have been used in the forms commercially available: about 99.8% pure for bismuth, and about 99.0% pure for indium. Although these metals have functioned very satisfactorily, small amounts of other metals such as mercury or gallium, or other impurities, can be added to bismuth or indium that may enhance the wetting characteristics of the molten indium or bismuth as regards both faces of the hot junction contact, and thus improve the operation of the module.

To more fully understand the invention and to explain the examples which follow, reference is made to the accompanying drawing which shows a cross-sectional view of a thermoelectric module comprising a p-type leg containing the thermoelectric materials tungsten diselenide (tantalum-doped) indicated at 2 and lead telluride (sodium-doped) indicated at 3 in the drawing. The purpose of the tantalum- and sodium-doping of these materials is to insure that the thermoelectric materials will be of a suitable conductivity. These thermoelectric materials are solidly bonded at 4 to form a single unit. A hot junction liquid contact 6 comprising a metal or metallic compound, preferably either bismuth or indium, forms the liquid contact of the module that wets the tungsten diselenide and absorb heat from any suitable source (not shown). The hot junction liquid contact material is contained within a refractory metal container 5. Molybdenum is a preferred material, but tungsten may be used. The refractory metal container is placed in contact with a material which will conduct heat well, and which will form a rigid strong end section to the module, such as, for example, nickel. This end section is indicated at 7. At the cold junction of the module, a common low temperature solder 8 has been found to be a satisfactory material as a bond between the thermoelectric sodium-doped lead telluride and a cooling block 12. A satisfactory solder is one comprising 50% lead and 50% tin. Electrical contact is made through the cold junction in the p-type leg to one power lead 9, and the other power lead 10 is connected to the n-type leg 11 of the module. The thermoelectric module is enclosed in the n-type leg 11 which comprises a constantan container or wall of 5 to 10 mil thickness. The n-type leg 11 is separated from the enclosed thermoelectric materials of p-type leg 1 by ceramic insulation 14 which will withstand the high operating temperatures of the module. A preferred material for insulation is zirconium dioxide. A cooling coil 13 for circulating a fluid surrounds the cold end of the module and conducts water, or other cooling fluid. Additional cooling liquid is circulated separately to and from cooling block 12. A suitable overall length for such a device as is shown is 1 to 1¼ inches, with the overall diameter being about ⅝ inch. Suitable dimensions for the encapsulated thermoelectric core are ¾-inch to 1-inch length by ½-inch to 9/16-inch diameter.

The following examples will more fully describe in detail the construction and operation of the thermoelectric device.

*Example 1*

A thermoelectric module as illustrated in the drawing was constructed comprising a p-type leg 1, an n-type leg 11 and a hot junction liquid contact 6. The p-type leg was composed of tantalum-doped tungsten selenide 2

$$(W_{0.98}Ta_{0.02}Se_2)$$

and sodium-doped lead telluride 3 as the thermoelectric materials. The hot junction liquid contact 6 of the thermoelectric module was bismuth. The bismuth was placed in contact with the tungsten diselenide thermoelectric and was contained within molybdenum container 5. A good bond was possible between the molybdenum container containing the hot junction liquid contact material, and the tungsten diselenide because these materials have coefficients of thermal expansion which are close; the value being $5.5\times10^{-6}/°$ C. for molybdenum and $6.8\times10^{-6}/°$ C. in the a-crystalline direction for the tantalum-doped tungsten diselenide.

The thermoelectric module was tested at an operating temperature of 1000° C. Bismuth is in the liquid state far below this temperature, its melting point being 271° C., and thus mechanical stresses within the module were eliminated. The contact resistance measured through the bismouth metal contact was less than 1 milliohm/cm.$^2$ as compared with a measured resistance of 3 to 5 milliohms/cm.$^2$ for a tungsten diselenide-molybdenum junction.

The thermoelectric module comprising bismuth as the hot junction liquid contact material was heated to 1000° C. over a period of two hours, and held at 1000° C. for two hours. No significant change in electrical properties was found to take place. At the conclusion of this testing, the module was taken apart and examined. The bismuth was found to have darkened and lost its metallic luster, but no corrosion of the tungsten diselenide nor of the molybdenum was observed. It is concluded that a small amount of the molybdenum and of the tungsten diselenide dissolved in the bismuth, but that equilibrium was attained when the dissolved amounts of these materials were at a low level, and therefore no serious corrosion results.

*Example 2*

A thermoelectric module was constructed in the same manner as described in Example 1, except that indium (melting point 156° C.) was used in place of bismuth for the hot junction liquid contact. The indium gave a low resistance contact, less than 1 milliohm/cm.$^2$, and after about four hours heating at 1000° C. showed no visible corrosion of either the molybdenum or the tungsten diselenide with which it had been in contact. Again, as with the bismuth, the indium had darkened and lost its metallic luster; however, if this was due to the dissolving of a small amount of molybdenum or of tungsten diselenide with which it was in contact, this solution was not sufficient to cause visible corrosion, nor any deleterious effect in the electrical properties of the module.

In other tests, similar to those described in the above examples, cuprous sulfide ($Cu_2S$) and cuprous selenide ($Cu_2Se$) were tested as hot junction liquid contact materials in contact with tungsten diselenide and formed very effective low resistance contacts at elevated temperatures and, therefore, can be used as substitutes for bismuth or indium. These materials were also tested together using equimolar portions as hot junction liquid contact material. The results of these tests indicated a low resistance contact when the modules utilizing these materials were operated at temperatures above their melting points, 1126° C. for $Cu_2S$ and 1110° C. for $Cu_2Se$. In cases where the thermoelectric module is designed to be used at temperatures above about 1000° C., these compounds will be found to be of particular advantage.

I claim:

1. A thermoelectric module comprising in combination a cold junction and a hot junction; a p-type leg, an n-type leg and a contact area therebetween at the said hot junction, the said p-type leg being composed of at least one thermoelectric material which is chemically stable at the operating temperatures of the said module, the said thermoelectric material contiguous to the said contact area being at least one diselenide from the class consisting of niobium, tantalum, tungsten and molybdenum, the said contact area of the said p-leg being coated with at least one hot junction contact material, the said material being liquid at the operation temperature of the module and being selected from the class consisting of bismuth, indium, cuprous selenide and cuprous sulfide; a refractory metal container between the said n-type leg and the said p-type leg in the said contact area and confining the said junction material against the said diselenide, the said refractory metal being a metal from the class consisting of molybdenum and tungsten.

2. The product of claim 1 in which the said p-type leg is formed from tungsten diselenide and sodium-doped lead telluride solidly bonded to the said diselenide to form a single unit, the said telluride diselenide being contiguous to the said contact area.

3. The product of claim 2 in which the said n-type leg consists of constantan and the said hot junction contact material is 99.8% pure bismuth.

4. The product of claim 2 in which the said n-type leg consists of constantan and the said hot junction contact material is 99.0% pure indium.

5. The product of claim 1 in which the said hot junction contact material is bismuth.

6. The product of claim 1 in which the said hot junction contact material is of indium.

References Cited

UNITED STATES PATENTS

| | | | |
|---|---|---|---|
| 1,127,424 | 2/1915 | Ferra | 136—228 |
| 3,296,033 | 1/1967 | Scuro | 136—205 |
| 2,838,589 | 6/1958 | Hunrath | 136—237 |
| 2,877,283 | 3/1959 | Justi | 136—203 |
| 2,952,725 | 9/1960 | Evans et al. | 136—237 X |
| 3,197,410 | 7/1965 | Brixner | 136—238 X |
| 3,231,965 | 2/1966 | Roes | 138—237 X |

ALLEN B. CURTIS, *Primary Examiner.*

WINSTON A. DOUGLAS, *Examiner.*